United States Patent [19]

Contiero et al.

[11] Patent Number: 4,949,142
[45] Date of Patent: Aug. 14, 1990

[54] INTEGRATED N-CHANNEL POWER MOS BRIDGE CIRCUIT

[76] Inventors: Claudio Contiero, Via Giovanni XXIII, 5, 20090 Buccinasco (MI); Paola Galbiati, Via Ramazzotti, 24, 20052 Monza (MI), both of Italy

[21] Appl. No.: 773,316

[22] Filed: Sep. 6, 1985

[30] Foreign Application Priority Data

Dec. 18, 1984 [IT] Italy ............................ 24126 A/84

[51] Int. Cl.[5] ............................................ H01L 29/78
[52] U.S. Cl. .................. 357/23.4; 357/23.8; 357/41; 357/46; 357/48
[58] Field of Search .................. 357/41, 23.8, 23.4, 357/46, 48

[56] References Cited

U.S. PATENT DOCUMENTS 4,288,801  9/1981  Ronen ................................... 357/46
4,546,370 10/1985  Curran .................................. 357/41
4,589,004  5/1986  Yasuda et al. ...................... 357/23.4

OTHER PUBLICATIONS

Inter. Rectifier, *Hexfet Databook*, El Segundo, Calif., pp. 12, 13, 36–49, 1981.

Primary Examiner—Jerome Jackson, Jr.
Attorney, Agent, or Firm—Harry M. Weiss

[57] ABSTRACT

The disclosed bridge circuit is fabricated using power MOS technology. Common terminals of the bridge circuit are integrated into common regions in the implementation. Electrodes, typically coupled together in the bridge circuit, are implemented by a shared conducting region in the integrated circuit of the semiconductor chip. By integrating the elements of the circuit, less area of the semiconductor chip is required as compared to an implementation involving 4 (four) discrete elements. Diodes are fabricated across the transistors to protect the elements against reverse biasing.

1 Claim, 2 Drawing Sheets

INTEGRATED N-CHANNEL POWER MOS BRIDGE CIRCUIT

BACKGROUND OF THE INVENTION

1. Field of the Invention

This invention relates generally to integrated circuits and, more particularly, to a bridge circuit preferably fabricated in N channel power metal-oxide-semiconductor (MOS) technology and to a method of fabricating an improved integrated bridge circuit.

2. Description of the Related Art

Bridge circuits of various types have been used, in the past, in a number of different electronic applications. The bridge circuit of the general type to which the present bridge circuit invention is directed is sometimes referred to as the H-bridge circuit. This class or type of circuit is suitable for general fast switching applications such as are needed in power supplies, audio amplifiers and small motor controls. It has been known in the past to implement such a class or type of bridge circuit with four discrete bipolar devices. This implementation has had the disadvantage of being relatively slow for many applications.

More recently, this class or type of bridge circuit has been implemented by four discrete power metal-oxide-semiconductor (MOS) devices assembled together on a single insulating type of substrate. However, the fabrication of this general type of bridge circuit by use of unipolar (MOS) discrete devices does not provide efficient use of space available in a semiconductor chip which is a disadvantage also shared by the four discrete bipolar device implementations.

SUMMARY

It is therefor an object of the present invention to provide an improved bridge circuit and an improved method of fabricating an improved integrated bridge circuit.

It is yet another object of the present invention to provide an improved bridge circuit implemented in power MOS technology.

It is a more particular object of the present invention to implement a bridge circuit in an integrated power MOS technology, thereby reducing the area of the semiconductor chip required for implementation of the circuit and increasing the speed of the circuit.

It is another more particular object of the present invention to provide a bridge circuit implemented in power MOS technology wherein all the component devices of the bridge circuit implementation are integrated in one monolithic semiconductor chip.

The aforementioned and other objects of the present invention are accomplished by an integrated bridge circuit fabricated in a power MOS technology. In the bridge circuit, the source electrode of a first transistor is coupled to a drain electrode of a second transistor; a source electrode of a fourth transistor is coupled to a drain electrode of a third transistor; drain electrodes of the first and fourth transistors are coupled together and source electrodes of the second and third transistors are coupled together. Diodes are coupled between the source and drains of all transistors. The coupled semiconductor regions (sources and drains), the diodes, and the gate electrodes are implemented in a single semiconductor chip or substrate, thereby minimizing the area in the semiconductor chip required for the circuit and providing increased circuit speed.

BRIEF DESCRIPTION OF THE PREFERRED EMBODIMENTS

According to one embodiment of the present invention, the integrated bridge circuit of the present invention comprises a semiconductor substrate, a first power MOS transistor located in the semiconductor substrate and having a source region, a drain region, and a gate electrode. A second power MOS transistor is provided in the semiconductor substrate and has a source region, a drain region and a gate electrode. A drain electrode of the second power MOS transistor is coupled to a source electrode of the first power MOS transistor. A third power MOS transistor is provided in the semiconductor substrate and has a source region, a drain region and a gate electrode. A source electrode of the third power MOS transistor is coupled to a source electrode of the second power MOS transistor. A fourth power MOS transistor is provided in the semiconductor substrate and has a source region, a drain region and a gate electrode. A source electrode of the fourth power MOS transistor is coupled to a drain electrode of the third power MOS transistor and a drain electrode of the fourth power MOS transistor is coupled to a drain electrode of the first power MOS transistor. A first, second, third and fourth diode are provided in the semiconductor substrate. The first diode is coupled between the source and drain regions of the first power MOS transistor. The second diode is coupled between the source and drain regions of the second power MOS transistor. The third diode is coupled between the source and drain regions of the third power MOS transistor. The fourth diode is coupled between the source and drain regions of the fourth power MOS transistor.

According to another embodiment of the present invention, a method is disclosed for fabricating an improved integrated bridge circuit implemented in power MOS technology which comprises the steps of providing a semiconductor substrate, forming a first power MOS transistor in the semiconductor substrate having a source region, a drain region, and a gate electrode. The method further comprises the step of forming a second power MOS transistor in the semiconductor substrate having a source region, a drain region and a gate electrode. A drain electrode of the second power MOS transistor is coupled to a source electrode of the first power MOS transistor. The method still further comprises the step of forming a third power MOS transistor in the semiconductor substrate having a source region, a drain region and a gate electrode. A source electrode of the third power MOS transistor is coupled to a source electrode of the second power MOS transistor. The method also comprises the step of forming a fourth power MOS transistor in the semiconductor substrate having a source region, a drain region and a gate electrode. A source electrode of the fourth power MOS transistor is coupled to a drain electrode of the third power MOS transistor. A drain electrode of the fourth power MOS transistor is coupled to a drain electrode of the first power MOS transistor. The method further comprises the step of forming a first, second, third and fourth diode in the semiconductor substrate. The first diode is coupled between the source and drain regions of the first power MOS transistor. The second diode is coupled between the source and drain regions of the second power MOS transistor. The third diode is coupled between the source and drain regions of the third power MOS transistor. The fourth diode is coupled between the source and drain regions of the fourth power MOS transistor.

The foregoing and other objects, features and advantages of the invention will be apparent from the following, more particular, description of the preferred embodiments of the invention as illustrated in the accompanying drawings.

DESCRIPTION AND OPERATION OF A PREFERRED EMBODIMENT

Detailed Description of the Figures

Figure 1:
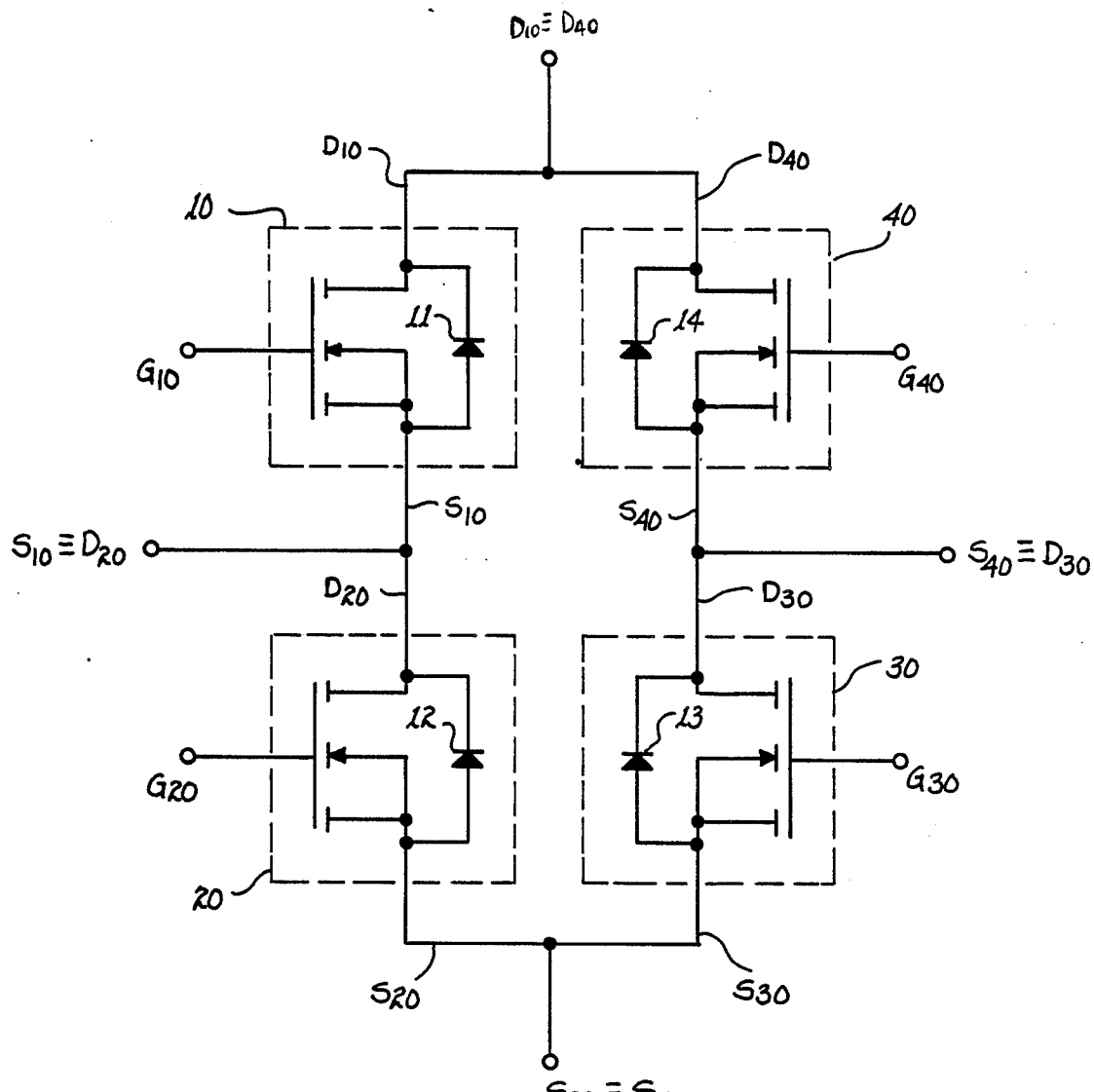
FIG. 1 is a schematic diagram of the integrated bridge circuit of the invention preferably implemented in N channel, power, metal-oxide-semiconductor (MOS) technology

Referring now to FIG. 1, a schematic diagram of the integrated bridge circuit is shown. The circuit preferably includes N channel, power MOS transistors 10, 20, 30 and 40, shown located within their respective identified boxes depicted in a broken line configuration. Drain electrode $D_{10}$ of the transistor 10 is coupled to drain electrode $D_{40}$ of the transistor 40. These two drain electrodes are connected or coupled to a common terminal as shown. Source electrode $S_{10}$ of the transistor 10 is coupled to drain electrode $D_{20}$ of the transistor 20. These two electrodes $S_{10}$ and $D_{20}$ are connected or coupled to a common terminal as shown. Source electorde $S_{40}$ of the transistor 40 is coupled to drain electrode $D_{30}$ of the transistor 30. These two electrodes $S_{40}$ and $D_{30}$ or connected or coupled to a common terminal as shown. Source electrode $S_{30}$ of the transistor 30 is coupled to source electrode $S_{20}$ of the transistor 20. These two source electrodes are connected or coupled to a common terminal as shown. Diode 11 is coupled between the source electrode $S_{10}$ and the drain electrode $D_{10}$ of the transistor 10, the anode of the diode 11 being coupled to the source electrode $S_{10}$ while the cathode of the diode 11 is coupled to the drain electrode $D_{10}$. Diode 12 is coupled between the drain electrode $D_{20}$ and the source electrode $S_{20}$ of the transistor 20, the anode of the diode 12 being coupled to the source electrode $S_{20}$ while the cathode of diode 12 is coupled to the drain electrode $D_{20}$. Diode 13 is coupled between the drain electrode $D_{30}$ and the source electrode $S_{30}$, the anode of diode 13 being coupled to the source electrode $S_{30}$ while the cathode of the diode 13 is coupled to the drain electrode $D_{30}$. Diode 14 is coupled between the drain electrode $D_{40}$ and the source electrode $S_{40}$ of the transistor 40, the anode of the diode 14 being coupled to the source electrode $S_{40}$ while the cathode of the diode 14 is coupled to the drain electrode $D_{40}$.

Figure 2:
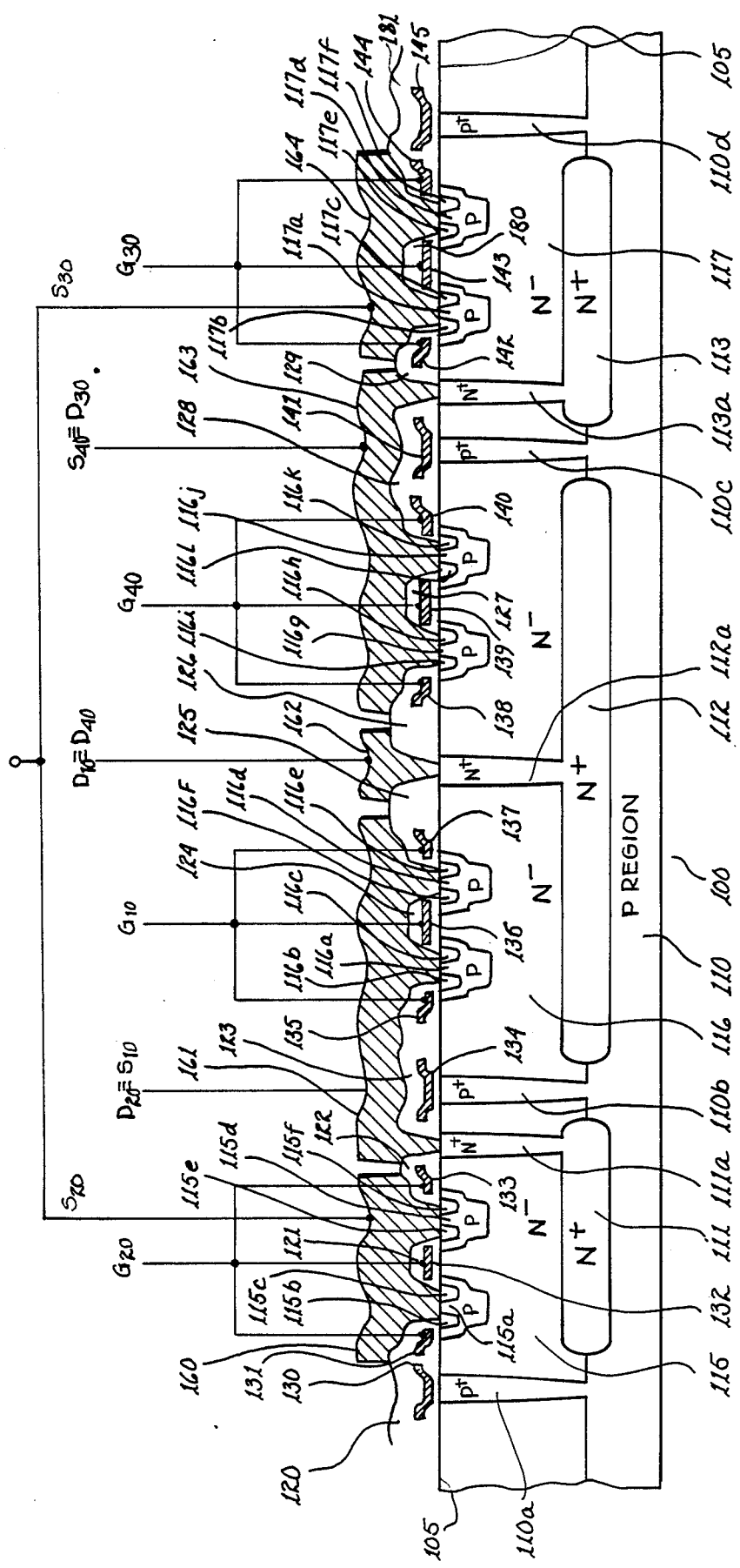
FIG. 2 is a cross-sectional view of a portion of a semiconductor substrate depicting various P and N type semiconductor regions and electrically conducting and insulation surface layers or regions implementing the integrated bridge circuit of FIG. 1 in N channel, power, metal-oxide-semiconductor (MOS) technology.

Referring now to FIG. 2, the cross-sectional configuration for the implementation of the integrated bridge circuit of FIG. 1 is shown. Semiconductor substrate 100 has a P region 110 that extends to a first surface 105 of the substrate 100 as P+ regions 110a, 110b, 110c, and 110d. Embedded in the substrate 100 are N+ drain regions 111, 112 and 113. These drain regions are preferably formed by diffusion or ion implantation techniques. Preferably, the P region 110 is a starting P type substrate region prior to the preferable epitaxial growth of an N type region thereon with the P+ (sinker type) regions 110a, 110b, 110c, and 110d being formed from the top or from both the top and bottom by diffusion techniques. The P+ regions 110a, 110b, 110c, and 110d together with the underlying connecting P region 110 provide an effective junction isolation region for the N type regions located within the bounds of the combined P+ and P isolation regions. Embedded in the substrate 100 are N+ regions 111, 112 and 113. These are drain regions and preferably formed by diffusion or ion implantation techniques. The N+ region 111 extends to the first surface 105 of the substrate 100 by means of a (sinker type) N+ region 111a. Elongated N+ region 112 extends to the substrate surface 105 by means of a (sinker type) region 112a. N+ region 113 extends to the substrate surface 105 by means of a (sinker type) N+ region 113a. Lower conductivity N− drain regions 115, 116 and 117 are preferably formed by epitaxial growth of an N− region on the P isolation region 110 after the formation of the N+ regions 111, 112 and 113 in the P region 110. The N− region 115 is generally disposed between the N+ region 111 and the substrate surface 105, the N− region 116 is generally disposed between N+ region 112 and the substrate surface 105, and the N− region 117 is generally disposed between the N+ region 113 and the substrate surface 105.

The N+ region 112a is preferably in the center portion of the N− region 116. Embedded in the N− region 115 with portions (preferably by diffusion)techniques extending to the substrate surface 105 are P channel type regions 115a and 115d. Embedded in the P channel region 115a with portions extending (preferably by diffusion or ion implantation) to the substrate surface 105 are N+ source regions 115b and 115c. Embedded in the P region 115d with portions extending (preferably by diffusion or ion implantation) to the substrate surface 105 are N+ source regions 115e and 115f. Embedded in the N− region 116 and extending (preferably by diffusion or ion-implantation) to the semiconductor surface 105 are P channel type regions 116a, 116d, 116g and 116j. Embedded in the P channel region 116a and extending (preferably by diffusion or ion-implantation) to the semiconductor surface 105 are N+ source regions 116b and 116c. Embedded in the P channel region 116d with portions extending (preferably by diffusion or ion-implantation) to the substrate surface 105 are N+ source regions 116f and 116e. Embedded in the P channel regions 116g and 116j with portions extending (preferably by diffusion or ion-implantation) to the substrate surface 105 are, respectively, N+ source regions 116i and 116h and N+ source regions 116l and 116k.

Embedded in the N− drain region 117 with portions extending (preferably by diffusion or ion-implantation) to the substrate surface 105 are P channel type regions 117a and 117d. Embedded in the P channel region 117a with portions extending (preferably by diffusion or ion-implantation) to the substrate surface 105 are N+ source regions 117b and 117c. Embedded in the P channel region 117d with portions extending (preferably by diffusion or ion-implantation) to the semiconductor surface 105 are N+ source regions 117e and 117f.

Deposited or formed on the substrate surface 105 are a plurality of insulation (such as silicon dioxide, etc.) regions or layers 120 through 129.

A first series of electrically conducting electrodes or regions 130 through 145 are embedded or in contact with their respective insulating layers or regions 120 through 129. The electrically conducting regions 130 and 131 are in contact with or embedded in the insulating region 120, the electrically conducting region 132 is embedded or in contact with the insulating region 121, the electrically conducting region 133 is embedded or in contact with the insulating region 112, the electrically conducting regions 134 and 135 are embedded or in contact with the insulating region 123, the electrically conducting region 136 is embedded or in contact with the insulating region 124, the electrically conducting region 137 is embedded or in contact with the insulating region 125, the electrically conducting region 138 is embedded or in contact with the insulating region 126, the electrically conducting region 139 is embedded or in contact with the insulating region 127, the electrically conducting regions 140 and 141 are embedded or in contact with the insulating region 128, the electrically conducting region 142 is embedded or in contact with the insulating region 129, the electrically conducting region 143 is embedded or in contact with the insulating region 180, and the electrically conduction regions 144 and 145 are embedded or in contact with the insulating region 181. Preferably, the electrically conducting regions 130–145 are doped polysilicon regions.

A second series of electrically conducting regions 160 through 164 are generally disposed over and/or in contact with the insulating regions 120–131 and these, preferably metal (i.e. aluminum or aluminum alloy) conductors 160–164 extend at selected location or positions, to the substrate surface 105. The electrically conducting region 160 is adjacent to the insulating regions 120 and 122, is over the electrically conducting region 132, and is in electrical shorting contact with the P channel region 115a and the associated N+ source regions 115b and 115c and also the P channel region 115d and associated N+ source regions 115e and 115f. The electrically conducting region 161 is adjacent to the insulating region 122 and the insulating regions 123, 124 and 125 and is in electrical contact with the N+ region 111a as well as in electrical shorting contact with the P channel region 116a and the associated N+ source regions 116b and 116c, and is in electrical shorting contact with the P channel region 116d and the associated N+ source regions 116e and 116f. The electrically conducting region 162 is adjacent to the insulating regions 125 and 126 and provides an electrical contact to the N+ region 112a which is electrically in contact with and part of the N+ (drain portion) region 112. The electrically conducting region 163 is adjacent to the insulating regions 126, 127, 128 and 129, and provides electrical shorting contact to the P channel region 116g and the associated N+ source regions 116h and 116i. The electrically conducting region 163 also provides an electrical shorting contact to the P channel region 116j and the associated N+ source regions 116k and 116l and, furthermore, electrically contacts the N+ region 113a which is in electrical contact with and part of the N+ (drain portion) region 113. The electrically conducting region 164 is adjacent to the insulating regions 129, 180 and 181 and provides an electrical shorting contact to the P channel region 117a and the associated N+ source regions 117b and 117c. The electrically conducting region 164 also provides an electrical shorting contact to the P channel region 117d and the associated N+ source regions 117d and 117e.

The electrically conducting region 130 is embedded in the insulating region 120 and is located over the P+ isolation portion region 110, the electrically conducting region 134 is similarly embedded in the insulating region 123 and is located over the P+ isolation portion region 110b, the electrically conducting region 141 is located in the insulating region 128 and is located over the P+ isolation portion region 110c, and the electrically conducting region 145 is located in the insulating region 181 and is located over the P+ isolation portion region 110d.

In the disclosed embodiment of FIG. 2 as viewed with respect to FIG. 1, electrode $G_{20}$ includes the electrically conductive electrodes or regions 131, 132 and 133 which are shown electrically connected together (see FIG. 2) while electrode $S_{20}$ includes the electrically conducting region 160 which is in electrically shorting contact to the N+ source regions 115 and 115c (and the associated P channel region 115a and to the N+ source regions 115c and 115f (and the associated P channel region 115d). Electrode $D_{20}=S_{10}$ includes the electrically conducting region or electrode 161. Electrode $G_{10}$ includes the electrically conducting electrodes or regions 135, 136 and 137. Electrode $D_{10}=S_{40}$ includes the electrically conducting electrode or region 162. Electrode $G_{40}$ includes the electrically conducting electrodes or regions 138, 139 and 140. Electrode $S_{40}=D_{30}$ includes the electrically conducting electrode or region 163. Electrode $G_{30}$ includes the electrically conducting electrodes or regions 142, 143 and 144, while electrode $S_{30}$ includes the electrically conducting electrode or region 164.

The electrodes 131, 132 and 133 function as doped polysilicon gate type electrodes to form an N channel across their respective underlying channel regions. For the N channel power MOS device 20 shown in FIG. 1, the equivalent device is shown in FIG. 2 and is comprised of the gate electrodes 131, 132 and 133, the two sets of N+ source regions 115b, 115c and 115e, 115f, the P channel regions 115a, 115d, the N type drain regions composed of N− region 115 and N+ regions 111 and 111a with the electrical contact to the N type drain regions being provided by means of the electrode 161 and the N+ regions 111a and 111; and the electrical contact to the N+ source regions of this device being provided by the shorting electrical contact electrode 160.

Similarly, the N channel power MOS device 10 shown in FIG. 1 is depicted in FIG. 2 and is comprised of the gate electrodes 135, 136 and 137, the two sets of N+ source regions 116b, 116c and 116e, 116f, the P channel regions 116a and 116d, the N type drain regions composed of N− region 116 and N+ regions 112 and 112a with the electrical contact to the N type drain regions being provided by means of the electrode 162 and the N+ regions 112a and 112; and the electrical contact to the N+ source regions of this device being provided by the shorting electrical contact electrode 161. It should be noted as an important feature and advantage of this integrated bridge circuit and structure that the N+ region 112a and the underlying N+ region 112 are common to both the N channel power MOS device 10 shown in FIG. 1 and 2 and the N channel power MOS device 40 shown in FIGS. 1 and 2. Thus, the N type drain regions of the N channel power MOS device 10 and the N channel power MOS device 40 are common and the electrode 162 is a common electrical contact electrode to the common drain regions of the N channel power MOS devices 10 and 40.

Similarly, the various electrodes and regions described above for the N channel power MOS devices 10 and 20 are similar, with the exception of the reference numerals, to the various electrodes and regions for the N channel power MOS devices 30 and 40.

With regard to the four diodes 11, 12, 13 and 14 (shown in FIG. 1) coupled respectively to the source and drain regions of the N channel power MOS devices 10, 20, 30 and 40, these diode devices are formed by the P region (115a, 115d), (116a, 116d), (116g, 116j), (117a, 117d) (as common anode for each of the four diodes) and the respective N type drain regions (115), (116), (117) for each N channel power MOS device 10, 20, 30 and 40 provides the cathode of each of the four diodes. The P region 110 has an electrical contact thereto (not shown) to provide a means for contacting this P region.

OPERATION OF THE PREFERRED EMBODIMENT

Referring once again to FIG. 1, several electrodes of the N channel power MOS transistors are coupled together to form the integrated bridge circuit of this invention. Comparing FIG. 1 with FIG. 2, it is seen that the drain electrode $D_{20}$ of the transistor 20 is coupled to the source electrode $S_{10}$ of the transistor 10, and that this coupling is accomplished in the integrated circuit implementation of FIG. 2 by the electrically conducting region 161. Similarly, the drain electrode $D_{10}$ of the transistor 10 is coupled to the drain electrode $D_{40}$ of the transistor 40 in the integrated bridge circuit and this coupling is accomplished in the integrated implementation of FIG. 2 by the electrically conducting region 162 to the common N+ region 112a, the common N+ region 112, and the associated N− drain regions. Source electrode $S_{40}$ of the transistor 40 is coupled to the drain electrode $D_{30}$ of the transistor 30 in the integrated bridge circuit and this coupling is accomplished in the integrated implementation by the electrically conducting element 163. It is thus clear that by utilizing the various electrode elements coupled as shown in the circuit diagram, the integrated circuit implementation reduces the space requirement in the semiconductor substrate and thereby provides increased circuit speed at reduced cost.

The function of the diodes shown as elements 11, 12, 13 and 14 in FIG. 1 is to conduct reverse currents in the devices whenever negative voltages are applied to the drains (for example for inductive circuits).

The common source connection $S_{20}$ for the N channel power MOS device 20 and $S_{30}$ for the N channel power MOS device 30 is implemented by electrically connecting together (not shown in FIG. 2 but shown in FIG. 1) the electrodes 160 and 164.

The above description is included to illustrate the operation of the prefered embodiment and is not meant to limit the scope of the invention. The scope of the invention is to be limited only by the following claims. From the above discussion, many variations will be apparent to one skilled in the art that would yet be encompassed by the spirit and scope of the claimed invention. For example, if desired, the integrated bridge current of this invention could be implemented with P channel power MOS devices in which case the various semiconductor regions depicted in FIG. 2 would be of opposite type conductivity than as shown in FIG. 2.

What is claimed is:

1. An integrated power MOS bridge circuit comprising, in combination:

a semiconductor substrate;

first, second and third junction isolated regions of a first conductivity type located in said substrate;

junction isolation means in said substrate for laterally separating and electrically isolating said first, second, and third junction isolated regions;

first, second and third buried drain layer regions of said first conductivity type in respective ones of said junction isolated regions;

a first MOS transistor in said first junction isolated region and a second MOS transistor in said second junction isolated region;

third and fourth MOS transistors in said third junction isolated region over said third buried layer region, said third and fourth MOS transistors each including a channel region of a second conductivity type spaced from said junction isolation means; and a sinker region of said first conductivity type in said third junction isolation region, said sinker region extending to said third buried drain layer region between said third and said fourth MOS transistors.

* * * * *